United States Patent
Kimura et al.

(10) Patent No.: US 12,438,538 B2
(45) Date of Patent: Oct. 7, 2025

(54) MOTOR DRIVER CIRCUIT

(71) Applicant: ROHM CO., LTD., Kyoto (JP)

(72) Inventors: Suzunosuke Kimura, Kyoto (JP); Kosuke Yasuji, Kyoto (JP); Hiroki Sugamoto, Kyoto (JP)

(73) Assignee: ROHM CO., LTD., Kyoto-shoi (JP)

( * ) Notice: Subject to any disclaimer, the term of this patent is extended or adjusted under 35 U.S.C. 154(b) by 23 days.

(21) Appl. No.: 18/616,703

(22) Filed: Mar. 26, 2024

(65) Prior Publication Data
US 2024/0333280 A1   Oct. 3, 2024

(30) Foreign Application Priority Data
Mar. 28, 2023  (JP) ................. 2023-052366

(51) Int. Cl.
*H03K 17/30*     (2006.01)
*H02M 3/07*      (2006.01)
*H03K 17/041*    (2006.01)

(52) U.S. Cl.
CPC ............ *H03K 17/302* (2013.01); *H02M 3/07* (2013.01); *H03K 17/04106* (2013.01); *H03K 2217/0063* (2013.01); *H03K 2217/0072* (2013.01)

(58) Field of Classification Search
CPC .................................. H03K 17/302
USPC ......................................... 327/108
See application file for complete search history.

(56) References Cited

U.S. PATENT DOCUMENTS

2024/0333284 A1* 10/2024 Yasuji .................. H03K 17/063

FOREIGN PATENT DOCUMENTS

JP          6208504 B2     9/2017

* cited by examiner

*Primary Examiner* — Tomi Skibinski
(74) *Attorney, Agent, or Firm* — CANTOR COLBURN LLP

(57) ABSTRACT

The present disclosure provides a motor driver circuit. The motor driver circuit includes a high-side driver that drives a high-side transistor according to a control signal. The high-side driver includes a voltage monitoring circuit, a timer circuit and a charge pump circuit. The voltage monitoring circuit asserts a detection signal when a detection voltage of the high-side transistor becomes lower than a threshold value. The timer circuit starts measuring a predetermined time in response to the control signal changing to an on state that the high side transistor is instructed to turn on, or in response to an assertion of the detection signal when the control signal is in the on state. The charge pump circuit is active while the timer circuit measures the predetermined time, generates a boosted voltage in response to a clock signal and supplies the boosted voltage to a gate of the high-side transistor.

8 Claims, 9 Drawing Sheets

MOTOR DRIVER CIRCUIT

CROSS REFERENCE TO RELATED APPLICATIONS

The present invention claims priority under 35 U.S.C. § 119 to Japanese Application No. 2023-052366, filed on Mar. 28, 2023, the entire contents of which being incorporated herein by reference.

TECHNICAL FIELD

The present disclosure relates to a motor driver circuit.

BACKGROUND

A motor driver circuit includes a bridge circuit connected to a coil of a motor. The bridge circuit includes a branch including a high-side arm and a low-side arm. The high-side arm and the low-side arm have a power transistor and a flywheel diode connected in parallel.

Each branch is capable of switching among three states, that is, a high output state in which a high-side transistor is turned on and a low-side transistor is turned off, a low output state in which the high-side transistor is turned off and the low-side transistor is turned on, and a high impedance state in which both of the high-side transistor and the low-side transistor are turned off.

PRIOR ART DOCUMENT

Patent Publication

[Patent document 1] Japan Patent Publication No. 6208504

DETAILED DESCRIPTION OF THE EMBODIMENTS

Summary of Embodiments

Figure 1:
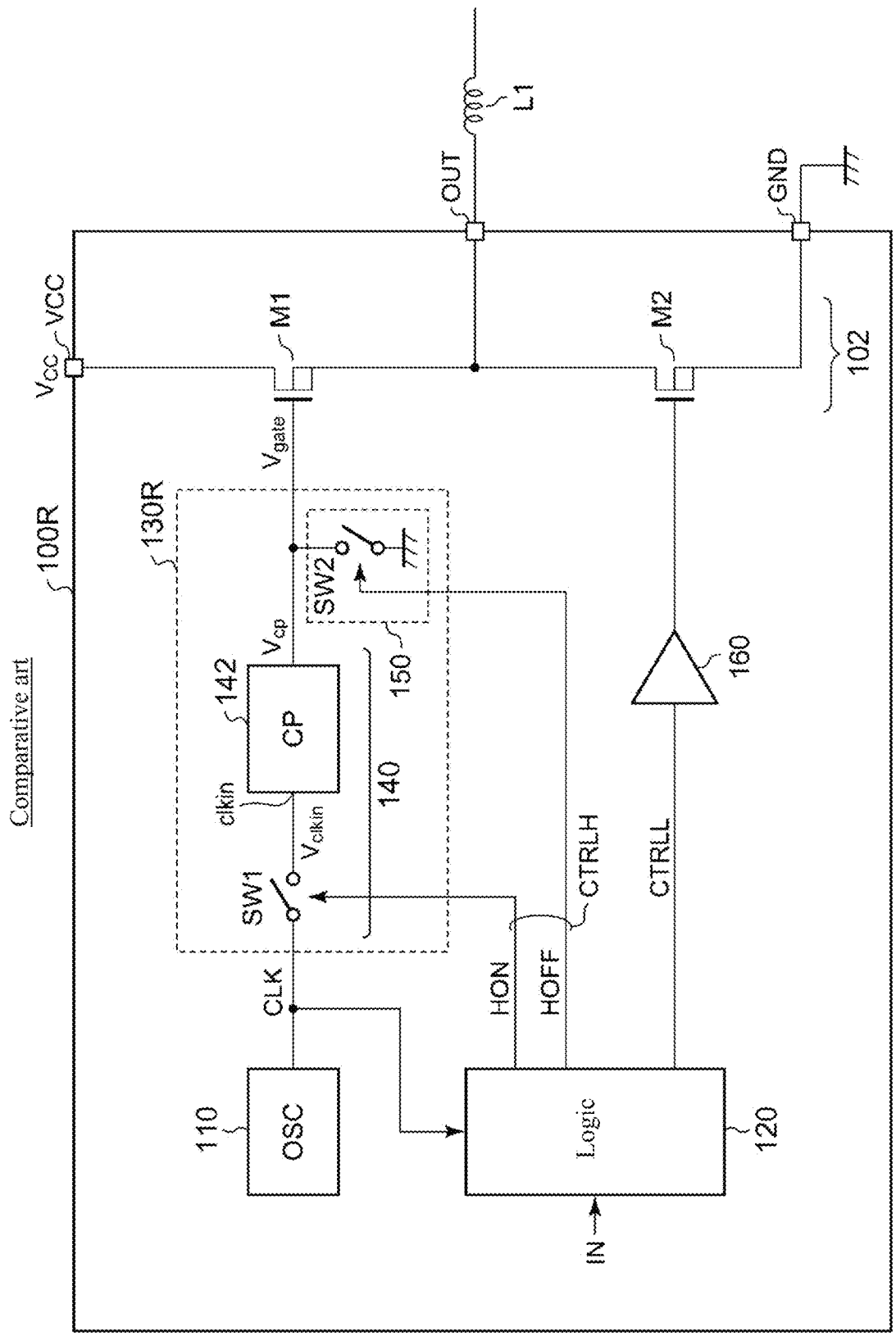
FIG. 1 is a circuit diagram of a motor driver circuit of the comparative art.

A summary of several exemplary embodiments of the present disclosure is described below. The summary serves as the preamble of the detailed description provided below and aims to provide fundamental understanding of the embodiments by describing several concepts of one or more embodiments in brief. It should be noted that the summary is not to be construed as limitations to the breadth of the application or disclosure. The summary is not a comprehensive summary of all conceivable embodiments, nor does it intend to specify important elements of all embodiments or to define the scope of a part of or all forms. For the sake of better description, "one embodiment" may be used to refer to one embodiment (an example or a variation example) or multiple embodiments (examples or variation examples) disclosed in the present disclosure.

A motor driver circuit according to an embodiment includes: a logic circuit, configured to generate a control signal that instructs a high-side transistor to turn on or off; and a high-side driver, configured to drive the high-side transistor according to the control signal. The high-side driver includes: a voltage monitoring circuit, configured to compare a detection voltage with a threshold value, wherein the detection voltage is a gate voltage or a gate-source voltage of the high-side transistor, and assert a detection signal when the detection voltage becomes lower than the threshold value; a timer circuit, configured to start measuring a predetermined time in response to the control signal changing to an on state that the high-side transistor is instructed to turn on, or in response to assertion of the detection signal when the control signal is in the on state; a charge pump circuit, configured to be active when the timer circuit measures the predetermined time, generate a boosted voltage in response to a clock signal, and supply the boosted voltage to a gate of the high-side transistor; and a turn-off circuit, configured to reduce a voltage at the gate of the high-side transistor when the control signal instructs the high-side transistor to turn off.

According to the configuration above, in a predetermined time after the control signal changes to an on state and during an on-period of the high-side transistor, the charge pump circuit is operated only in a period of the predetermined time after the voltage at the gate reduces, and the charge pump circuit is stopped in a period other than the above. Accordingly, switching loss of the charge pump circuit can be reduced, hence performing high-efficiency operations.

In one embodiment, the motor driver circuit can further include: an oscillator, configured to generate the clock signal; and a first switch, connected between an output node of the oscillator and a clock input node of the charge pump circuit. The first switch can also be controlled according to an output of the timer circuit.

In one embodiment, the turn-off circuit can further include a second switch connected between the gate of the high-side transistor and a ground, or between the gate and a source of the high-side transistor.

In one embodiment, the charge pump circuit includes a reference input node, and is configured to be outputtable a voltage greater than the voltage supplied to the reference input node by a predetermined voltage in response to the clock signal, and the motor driver circuit further includes a third switch connected between the reference input node of the charge pump circuit and a drain of the high-side transistor. The third switch can be turned on when the control signal changes to the on state, and after a delay, the timer circuit starts measuring the predetermined time. Accordingly, the high-side transistor can be turned on at a high speed, and the number of times of switching of the charge pump circuit can be reduced, hence further reducing power consumption.

In one embodiment, the motor driver circuit can also be integrated on one semiconductor substrate. The so-called "integrated" includes a situation in which all constituting elements of a circuit are formed on a semiconductor substrate, or a situation in which main constituting elements of a circuit are integrated. In addition, a part of resistors or capacitors can be arranged outside the semiconductor substrate and be used to adjust circuit constants. By integrating circuits on one chip, the circuit area can be reduced and characteristics of circuit elements can be kept uniform.

EMBODIMENTS

Details of preferred embodiments are provided with the accompanying drawings below. The same or equivalent constituent elements, parts and processes in the accompanying drawings are represented by the same denotations, and repeated description is omitted as appropriate. Moreover, the embodiments are illustrative of and are not restrictive of the disclosure. All features and combinations thereof described in the embodiments are not necessarily intrinsic characteristics of the disclosure.

In the description of the present application, an expression "a state of a component A connected to a component B" includes a situation where the component A and the component B are physically directly connected, or a situation where the component A is indirectly connected to the component B via another component, provided that the indirect connection does not result in substantial influences on their electrical connection or does not impair functions or effects exerted by their connection.

Similarly, an expression "a state of a component C arranged between a component A and a component B" also includes, in addition to a situation where the component A and the component C, or the component B and the component C are directly connected, an indirect connection via another component, provided that the indirect connection does not result in substantial influences on their electrical connection or does not impair functions or effects exerted by their connection.

Moreover, the vertical axis and horizontal axis in the waveform diagrams or timing diagrams referenced in the present application are appropriately scaled up or scaled down for better understanding, and the waveforms are also simplified for better understanding.

A motor driver circuit of a comparative art is illustrated before a motor driver circuit of an embodiment is described.

FIG. 1 shows a circuit diagram of a motor driver circuit 100R of the comparative art.

The motor driver circuit 100R includes a branch 102 of an inverter circuit, an oscillator 110, a logic circuit 120, a high-side driver 130R and a low-side driver 160. A coil L of a motor which is a driving target is connected to an output pin OUT. A power supply voltage $V_{CC}$ is supplied to a power supply pin VCC, and a ground pin GND is grounded.

The branch 102 includes a high-side transistor M1 serving as an upper arm and a low-side transistor M2 serving as a lower arm.

The oscillator 110 generates a clock signal CLK. The clock signal CLK can be a system clock of the motor driver circuit 100R and is supplied to the logic circuit 120.

The logic circuit 120 generates a control signal CTRLH instructing the high-side transistor M1 to turn on and off according to an input signal IN. Moreover, the logic circuit 120 generates a control signal CTRLL instructing the low-side transistor M2 to turn on and off according to an input signal IN.

The high-side driver 130R drives the high-side transistor M1 according to the control signal CTRLH. The low-side driver 160 drives low-side transistor M2 according to the control signal CTRLL.

The high-side driver 130R includes a turn-on circuit 140R and a turn-off circuit 150. The turn-on circuit 140R includes a charge pump circuit 142 and a first switch SW1. The charge pump circuit 142 performs a charge pump operation according to a clock signal Velkin supplied to a clock input node clkin and generates a boosted voltage $V_{CP}$. The boosted voltage $V_{CP}$ is supplied to a gate of a high-side transistor M1. The charge pump circuit 142 can be implemented by a 2× boost or 3× boost charge pump circuit or can be implemented by a voltage-addition-type charge pump circuit.

The first switch SW1 is disposed between the clock input node clkin of the charge pump circuit 142 and an output node of the oscillator 110.

The control signal CTRLH includes a high-side turn-on signal HON and a high-side turn-off signal HOFF. The high-side turn-on signal HON is a signal that is asserted (for example, high) during an on-period of the high-side transistor M1, and a low-side turn-on signal LON is a signal that is asserted (for example, high) during an off-period of the high-side transistor M1.

The first switch SW1 is turned on during an assertion period of the high-side turn-on signal HON. Accordingly, the charge pump circuit 142 performs a charge pump operation, the boosted voltage $V_{CP}$ is supplied to the gate of the high-side transistor M1, and the high-side transistor M1 becomes turned on.

When the control signal CTRLH instructs the high-side transistor M1 to turn off, the turn-off circuit 150 causes a decrease in a voltage $V_{gate}$ at the gate of the high-side transistor M1. The turn-off circuit 150 includes a second switch SW2 that is turned on during an assertion period of the high-side turn-off signal HOFF. The second switch SW2 is connected between the gate of the high-side transistor M1 and a ground. During an on-period of the second switch SW2, charge in a gate capacitor of the high-side transistor M1 is discharged, the gate voltage $V_{gate}$ decreases, and the high-side transistor M1 becomes turned off.

Figure 2:
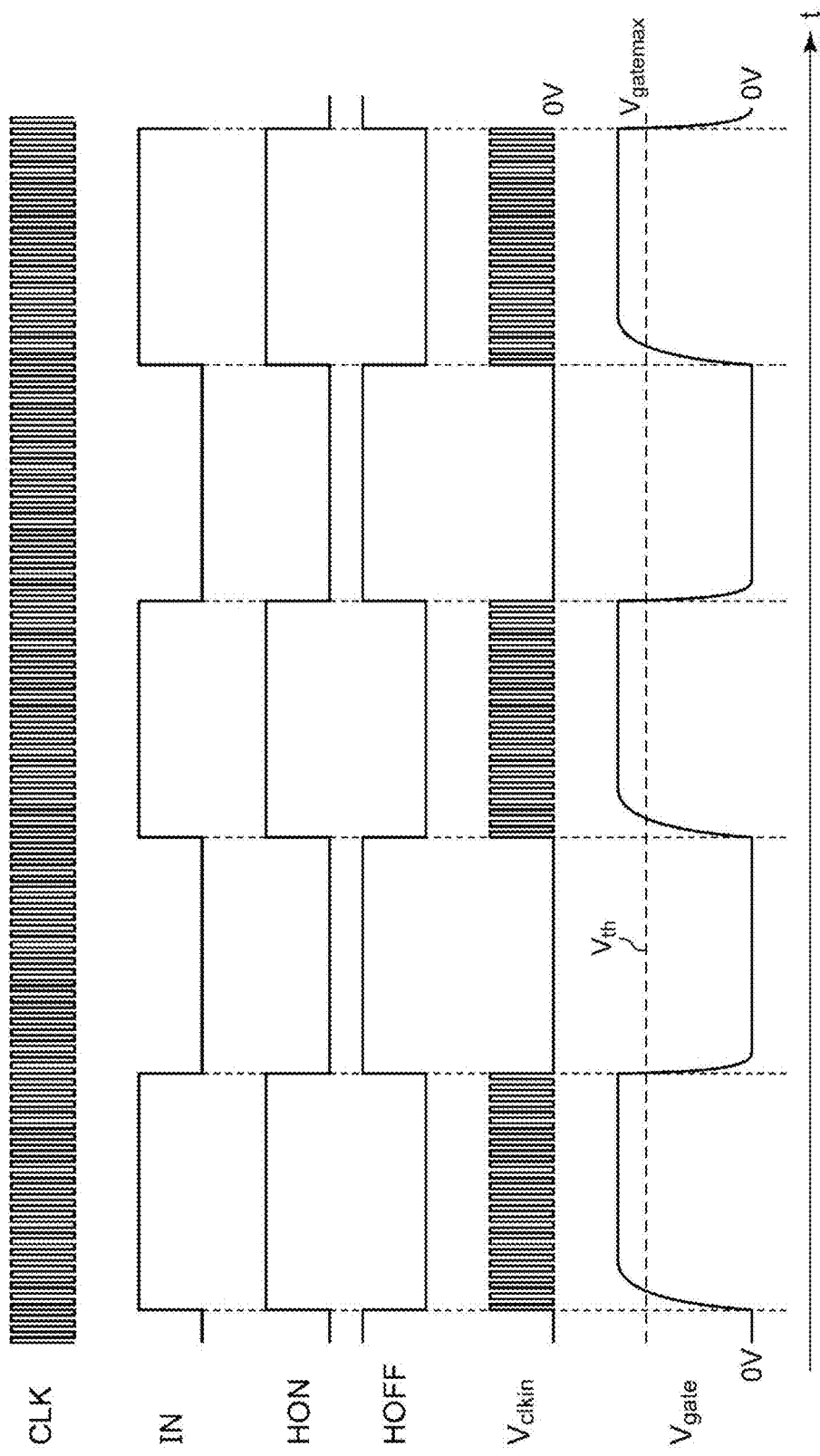
FIG. 2 is a waveform diagram of the operation of the motor driver circuit in FIG. 1.

The configuration of the motor driver circuit 100R is as described above. The operation of the motor driver circuit 100R is described below. FIG. 2 shows a waveform diagram of the operation of the motor driver circuit 100R in FIG. 1. During a high period of the input signal IN, the high-side turn-on signal HON changes to high, and the first switch SW1 is turned on. Accordingly, the clock signal CLK is supplied to the clock input node clkin of the charge pump circuit 142. The charge pump circuit 142 performs a charge pump operation according to the clock signal Velkin to cause the gate voltage $V_{gate}$ of the high-side transistor M1 to increase to a voltage level $V_{gatemax}$ higher than a threshold voltage $V_{th}$ of the high-side transistor M1 that is turned on. Accordingly, the high-side transistor M1 is turned on. The threshold voltage $V_{th}$ is represented by an equation below:

$$V_{th} = V_{CC} + V_{gs(th)},$$

where $V_{gs(th)}$ is a gate threshold voltage of a MOSFET.

During a high period of the high-side turn-on signal HON, the clock signal Velkin is supplied to the clock input node clkin of the charge pump circuit 142, and the charge pump circuit 142 continues switching.

When the input signal IN changes to low, the high-side turn-off signal HOFF changes to high, and the first switch SW1 is turned off and the turn-off circuit 150 is turned on. Accordingly, the gate voltage $V_{gate}$ of the high-side transistor M1 decreases to 0 V, and the high-side transistor M1 is turned off.

The operation of the motor driver circuit 100R is as described above. In the motor driver circuit 100R, the charge pump circuit 142 continues switching during an on-period of the high-side transistor M1. Thus, switching loss is generated, causing an issue of increased power consumption of the motor driver circuit 100R.

In the motor driver circuit 100R of several embodiments described below, the issue above is solved.

First Embodiment

Figure 3:
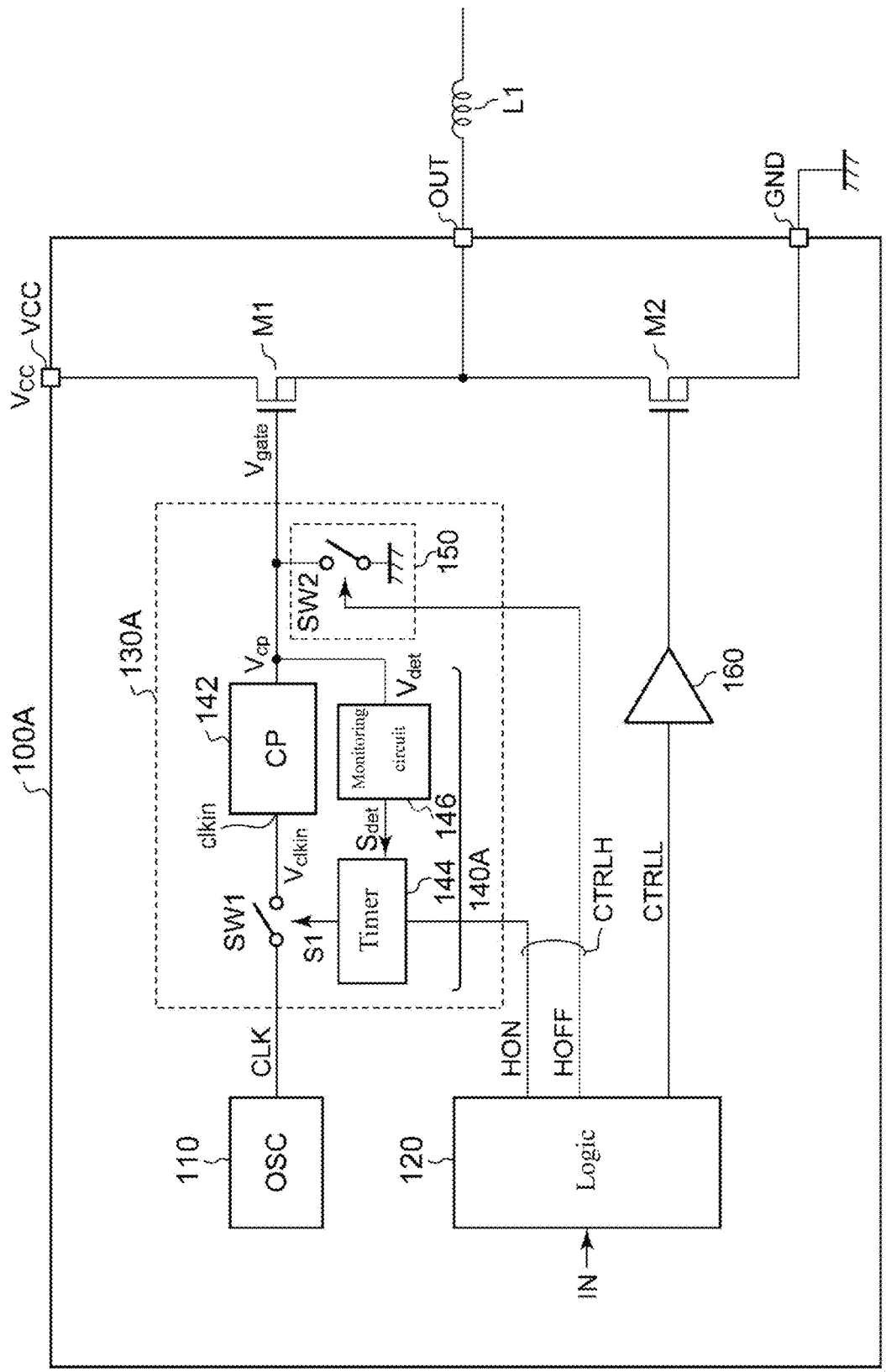
FIG. 3 is a circuit diagram of a motor driver circuit according to a first embodiment.

FIG. 3 shows a circuit diagram of a motor driver circuit 100A according to the first embodiment. The high side driver 130A of the motor driver circuit 100A includes a turn-on circuit 140A and a turn-off circuit 150. The motor driver circuit 100A is an integrated circuit (IC) integrated on one semiconductor substrate. The number of phases of the inverter is not particularly limited and can be single phase or multiphase (for example, three phases).

A turn-on circuit 140A includes the first switch SW1, the charge pump circuit 142, a timer circuit 144 and a voltage monitoring circuit 146.

The voltage monitoring circuit 146 monitors a gate voltage $V_{gate}$ of the high-side transistor M1 or a gate-source voltage $V_{gs}$, that is, a detection voltage $V_{det}$. The voltage monitoring circuit 146 compares the detection voltage $V_{det}$ with a threshold value $V_{gatemin}$, and asserts a voltage reduced detection signal $S_{det}$ upon detecting that the detection voltage $V_{det}$ is lower than the threshold value $V_{gatemin}$. The threshold value $V_{gatemin}$ is set to be higher than a threshold voltage $V_{th}$.

The timer circuit 144 measures a predetermined time $T_{TIMER1}$ in response to a high-side control signal CTRLH (a high-side turn-on signal HON) changing to an on state that the high-side transistor M1 is instructed to turn on. Moreover, the timer circuit 144 starts measuring a predetermined time $T_{TIMER2}$ in response to assertion of the detection signal $S_{det}$ when the high-side turn-on signal HON is in the on state.

The charge pump circuit 142 is active when the timer circuit 144 measures the predetermined times $T_{TIMER1}$ and $T_{TIMER2}$, generates the boosted voltage $V_{CP}$ in response to the clock signal Vclkin, and supplies the boosted voltage $V_{CP}$ to the gate of the high-side transistor M1. The charge pump circuit 142 is disabled when the timer circuit 144 ends measuring of a predetermined time $T_{TIMER}$.

More specifically, the timer circuit 144 asserts (for example, setting to high) a control signal S1 during a period of measuring the predetermined time $T_{TIMER}$ and hence sets the first switch SW1 to the on state, and nulls (for example, setting to low) the control signal S1 after the predetermined time $T_{TIMER}$ has elapsed and hence sets the first switch SW1 to the off state. As a result, during the predetermined time $T_{TIMER}$, the clock signal Vclkin is supplied to the charge pump circuit 142, and then supplying of the clock signal Vclkin is stopped.

The predetermined time $T_{TIMER}$ is set to be longer than a time until the output voltage $V_{CP}$ of the charge pump circuit 142 reaches a maximum level $V_{gatemax}$. The maximum level $V_{gatemax}$ is set to be higher than the threshold $V_{th}=V_{CC}+V_{gs(th)}$.

Figure 4:
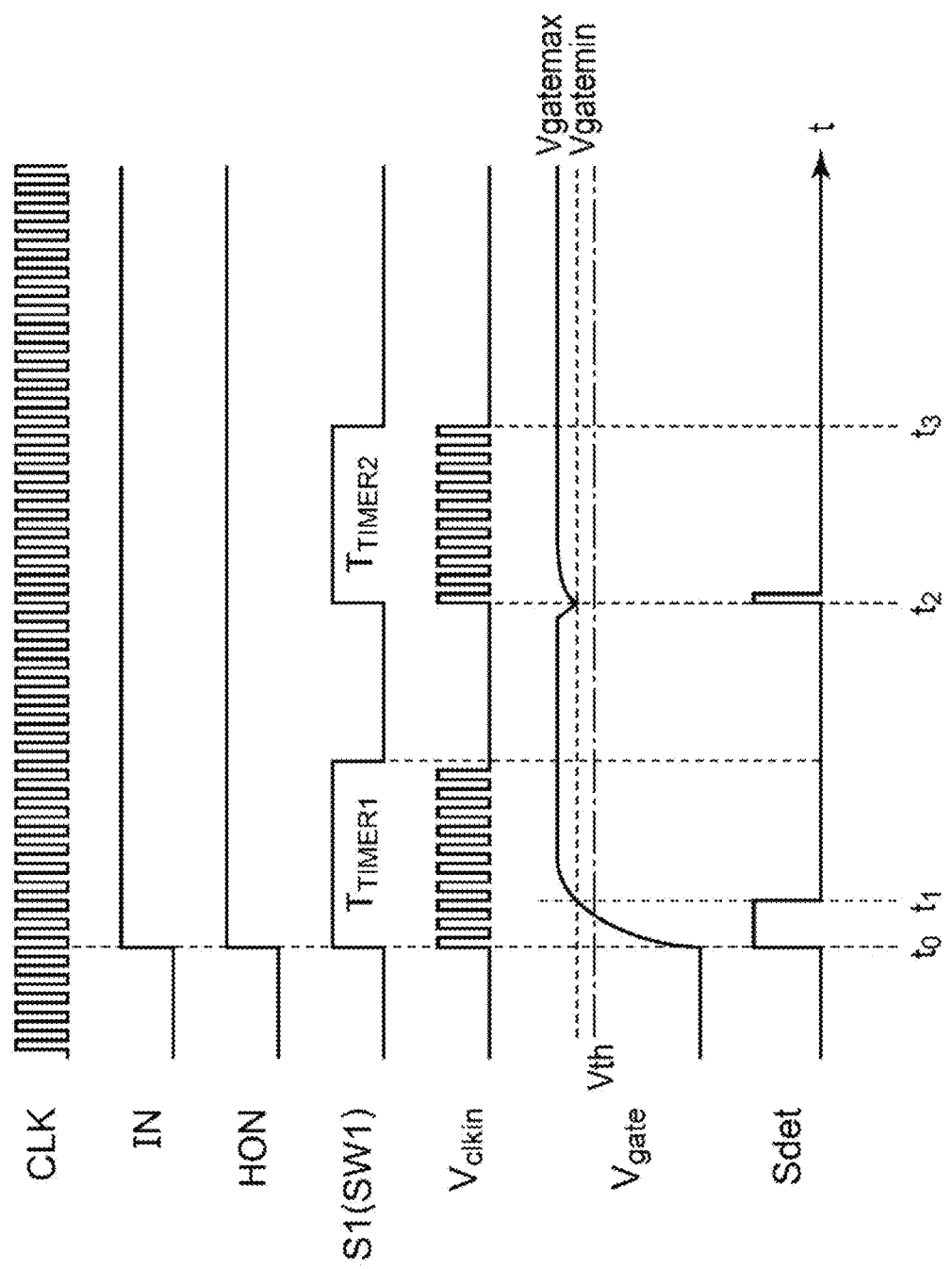
FIG. 4 is a waveform diagram of the operation of the motor driver circuit in FIG. 3.

The configuration of the motor driver circuit 100A is as described above. The operation of the motor driver circuit 100A is described below. FIG. 4 shows a waveform diagram of the operation of the motor driver circuit 100A in FIG. 3.

When a control input IN changes to high at a timing $t_0$, the high-side turn-on signal HON is asserted. The timer circuit 144 starts a timer operation by using the change in the high-side turn-on signal HON as a trigger. Then, during a period of the predetermined time $T_{TIMER1}$ between the timings $t_0$ and $t_1$, the first switch SW1 is turned on. During the on-period of the first switch SW1, the charge pump circuit 142 performs a charge pump operation, and the gate voltage $V_{gate}$ of the high-side transistor M1 rises to the maximum level $V_{gatemax}$ thereof. After the predetermined time $T_{TIMER1}$ has elapsed, the first switch SW1 is turned off and the charge pump circuit 142 is stopped.

At a timing $t_2$, when the gate voltage $V_{gate}$ of the high-side transistor M1 reduces due to a certain reason and the gate voltage $V_{gate}$ is lower than the minimum level $V_{gatemin}$, the voltage reduced detection signal $S_{det}$ is asserted. In response to assertion of the voltage reduced detection signal $S_{det}$, the timer circuit 144 restarts the timer operation. Then, during a period of the predetermined time $T_{TIMER2}$ between the timings $t_2$ and $t_3$, the first switch SW1 is again turned on. During the on-period of the first switch SW1, the charge pump circuit 142 performs a charge pump operation, and the gate voltage $V_{gate}$ of the high-side transistor M1 rises to the maximum level $V_{gatemax}$ thereof. After the predetermined time $T_{TIMER2}$ has elapsed, the first switch SW1 is turned off and the charge pump circuit 142 is stopped.

The operation of the motor driver circuit 100A is as described above. In the motor driver circuit 100A, after the input signal IN changes to high, the charge pump circuit 142 accordingly operates only in a charging period $T_{CHG}$ determined by the timer time $T_{TIMER1}$, and the charge pump circuit 142 stops operating after the charging period $T_{CHG}$ has elapsed. Accordingly, compared to the comparative art, switching loss of the charge pump circuit 142 is reduced, hence improving efficiency.

Moreover, after the high-side transistor M1 is turned on, when the gate voltage $V_{gate}$ thereof reduces due to a certain reason, the charge pump circuit 142 is operated by again operating the timer circuit 144, such that the gate voltage $V_{gate}$ rises.

Second Embodiment

Figure 5:
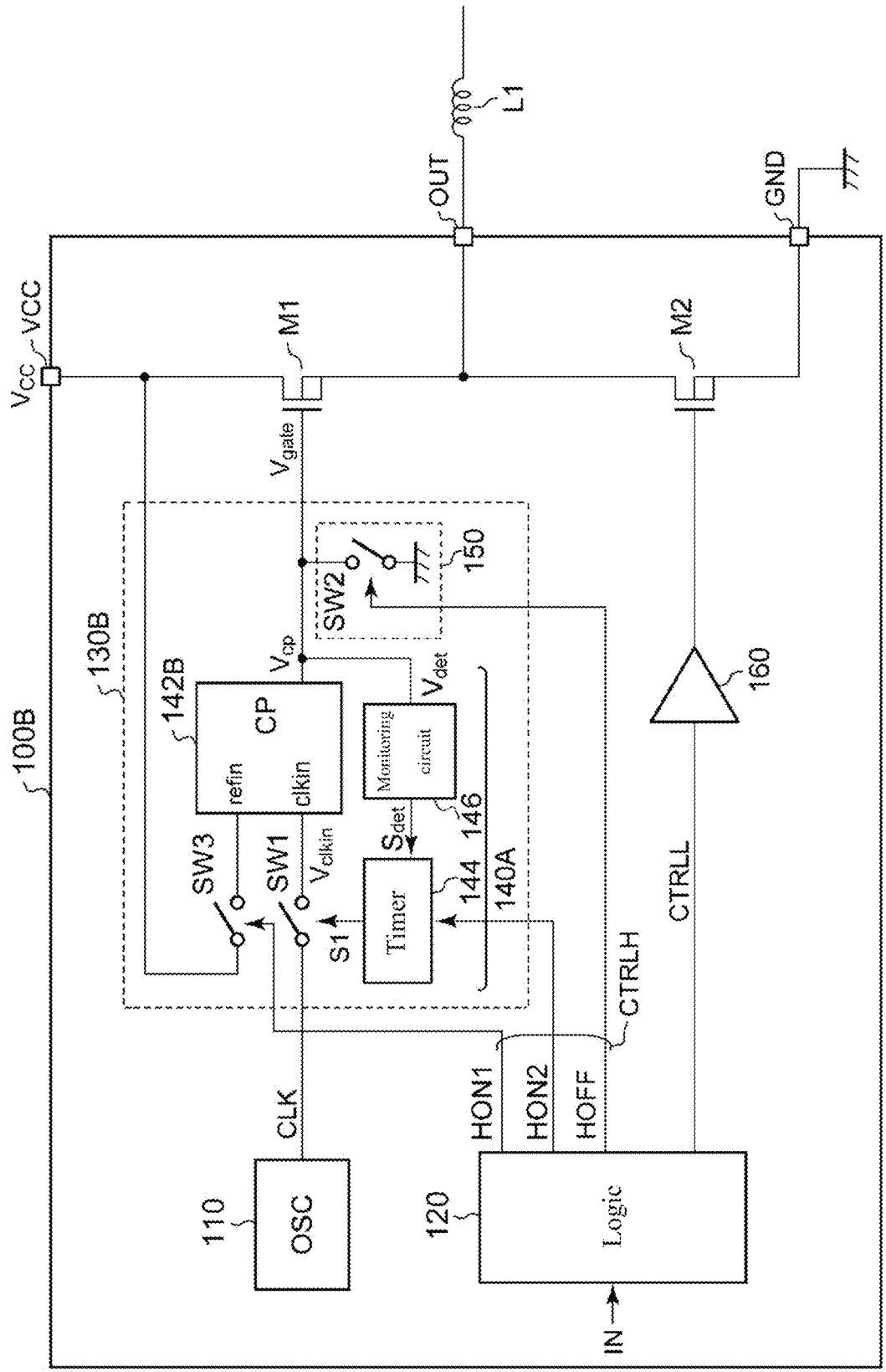
FIG. 5 is a circuit diagram of a motor driver circuit according to a second embodiment.

FIG. 5 shows a circuit diagram of a motor driver circuit 100B according to the second embodiment. In the motor driver circuit 100B, a high-side driver 130B further includes a third switch SW3.

A charge pump circuit 142B is a voltage-addition-type charge pump circuit and includes a reference input node refin in addition to a clock input node clkin. The charge pump circuit 142B is configured to be able to output a boosted voltage VCP higher by a predetermined voltage width ΔV than the voltage Vref supplied to the reference input node refin in response to the clock signal Vclkin.

$$V_{CP} = V_{ref} + \Delta V$$

The third switch SW3 is connected to a $V_{CC}$ pin, that is, between a drain of the high-side transistor M1 and the reference input node refin of the charge pump circuit 142B.

The high-side control signal CTRLH generated by a logic circuit 120B includes two high-side turn-on signals HON1 and HON2, and a high-side turn-off signal HOFF.

The logic circuit 120B asserts the first high-side turn-on signal HON1 when the control input IN changes to a level that instructs the high-side transistor M1 to turn on. A third switch SW3 is turned on by assertion of the first high-side turn-on signal HON1.

After the assertion of the first high-side turn-on signal HON1 and after a predetermined delay td has elapsed, the logic circuit 120B asserts the second high-side turn-on signal HON2. The second high-side turn-on signal HON2 is input to a timer circuit 144B. The timer circuit 144B measures the predetermined time $T_{TIMER}$ in response to the assertion of the second high-side turn-on signal HON2 and asserts the control signal S1 during the period of measuring and hence turns on the first switch SW1.

Moreover, during the on-period of the high-side transistor M1 and when the voltage reduced detection signal $S_{det}$ is asserted, the timer circuit 144B measures the predetermined time $T_{TIMER2}$, and asserts the control signal S1 during the period of measuring and hence turns on the first switch SW1.

Figure 6:
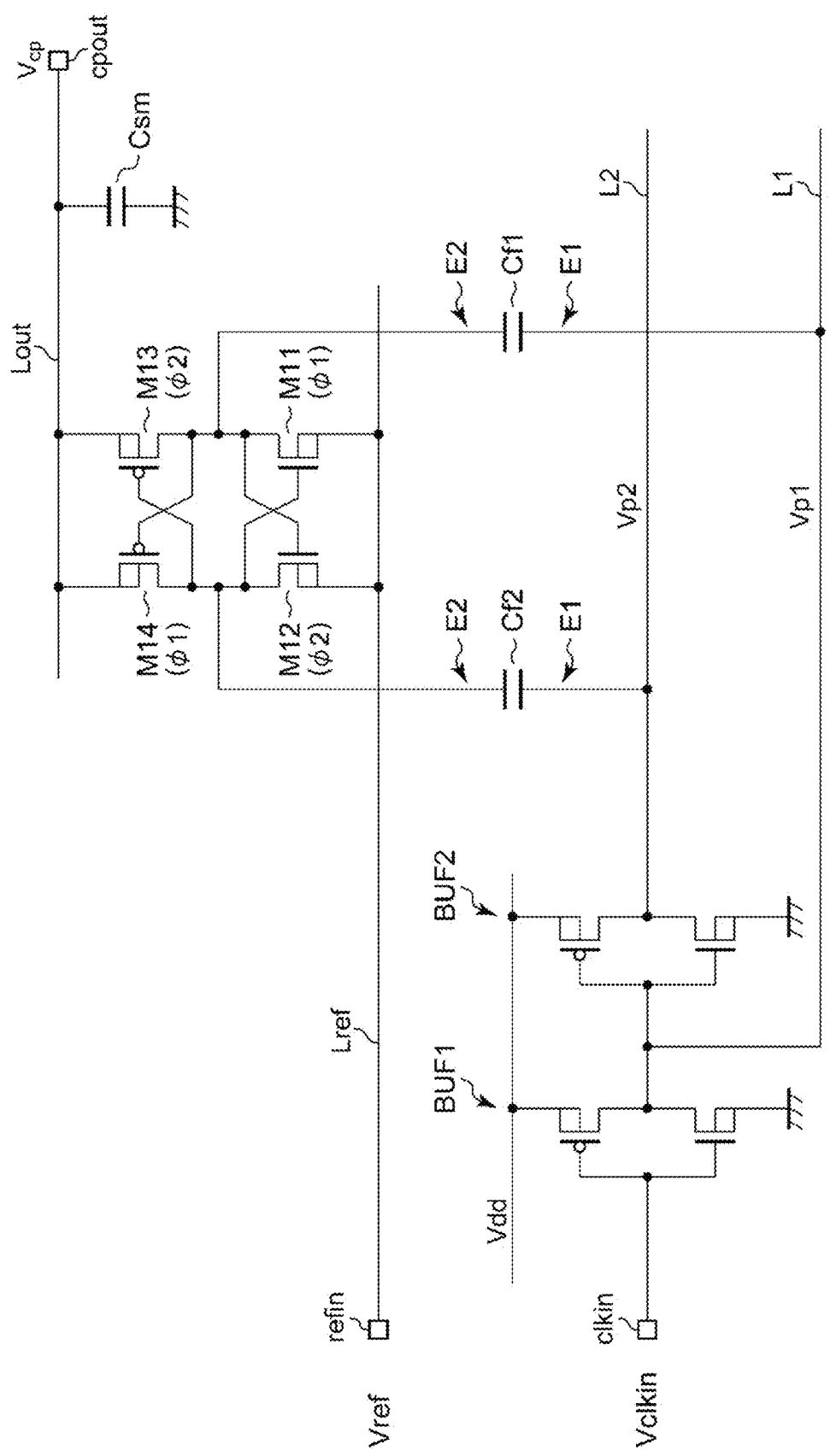
FIG. 6 is a circuit diagram of a configuration example of a charge pump circuit.

FIG. 6 shows a circuit diagram of a configuration example of the charge pump circuit 142B. The charge pump circuit 142B includes buffers BUF1 and BUF2, flying capacitors Cf1 and Cf2, transistors M11 to M14, and an output capacitor (a smoothing capacitor) Csm.

The buffers BUF1 and BUF2 are inverters to which a power supply voltage Vdd is supplied. The buffer BUF1 generates a first pulse signal Vp1 having an amplitude of Vdd on a first line L1 according to the clock input Vclkin. Moreover, the buffer BUF2 generates a second pulse signal Vp2 having an amplitude of Vdd on a second line L2 according to an output of the buffer BUF1. The first pulse signal Vp1 and the second pulse signal Vp2 are in inverse phases from each other.

A first end E1 of the first flying capacitor Cf1 is connected to the first line L1, and a first end E1 of the second flying capacitor Cf2 is connected to the second line L2. The first transistor M11 is connected between a reference line Lref and a second end E2 of the first flying capacitor Cf1. The second transistor M12 is connected between the reference line Lref and a second end E2 of the second flying capacitor Cf2. The third transistor M13 is connected between an output line Lout and the second end E2 of the first flying capacitor Cf1. The fourth transistor M14 is connected between the output line Lout and the second end E2 of the second flying capacitor Cf2. A gate of each of the first transistor M11 and the third transistor M13 is connected to the second end E2 of the second flying capacitor Cf2. A gate of each of the second transistor M12 and the fourth transistor M14 is connected to the second end E2 of the first flying capacitor Cf1.

The output voltage $V_{CP}$ of the charge pump circuit 142B is represented by:

$$V_{CP} = V_{ref} + VDD$$

The configuration of the charge pump circuit 142B is as described above.

Figure 7:
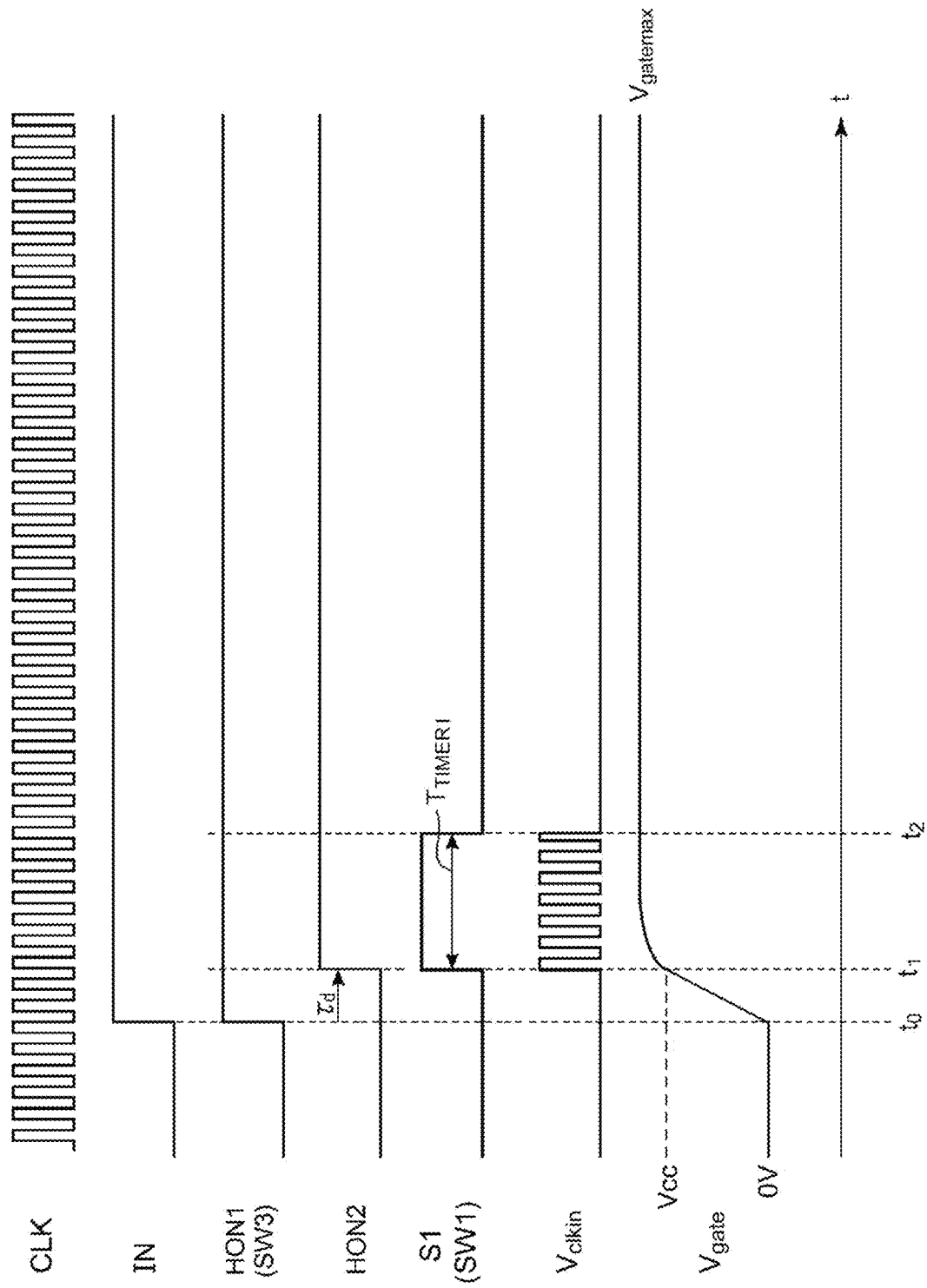
FIG. 7 is a waveform diagram of the operation of the motor driver circuit in FIG. 5.

FIG. 7 shows a waveform diagram of the operation of the motor driver circuit 100B in FIG. 5.

When the input signal IN changes to high at a timing $t_0$, the first high-side turn-on signal HON1 becomes high, and the third switch SW3 is turned on. As a result, voltage $V_{CC}$ is supplied to the reference input node refin of charge pump circuit 142B, and the output voltage of charge pump circuit 142B quickly rises to voltage $V_{CC}$.

At the timing $t_1$ after the predetermined delay τd has elapsed from the timing $t_0$, the second high-side turn-on signal HON2 changes to high, and the timer operation of the timer circuit 144B is started. The control signal S1 changes to high during the period of measuring the time $T_{TIMER1}$ by the timer circuit 144B. Accordingly, the clock signal Vclkin is supplied to the clock input node clkin of the charge pump circuit 142B, and the charge pump circuit 142B operates. With the charge pump operation, the output voltage $V_{CP}$ of the charge pump circuit 142B increases from Vcc as a starting point to the maximum level $V_{gatemax}$. Then, the control signal S1 changes to low at the timing $t_2$, the first switch SW1 is turned off, and the charge pump circuit 142B is stopped.

The operation of the motor driver circuit 100B is as described above. According to the motor driver circuit 100B, during a period between timings $t_0$ and $t_1$, the gate voltage $V_{gate}$ of the high-side transistor M1 is caused to increase rapidly to the power supply voltage $V_{CC}$, and then rises to the maximum level $V_{gatemax}$ by the charge pump operation. Accordingly, compared to the first embodiment, the high-side transistor M1 can be turned on within a short period of time. Moreover, since a period in which the charge pump circuit 142B performs a charge pump operation can be reduced, power consumption can be further decreased.

Third Embodiment

In the second embodiment, the logic circuit 120 counts the time td; however, the time td can also be counted by a timer circuit 144C.

Figure 8:
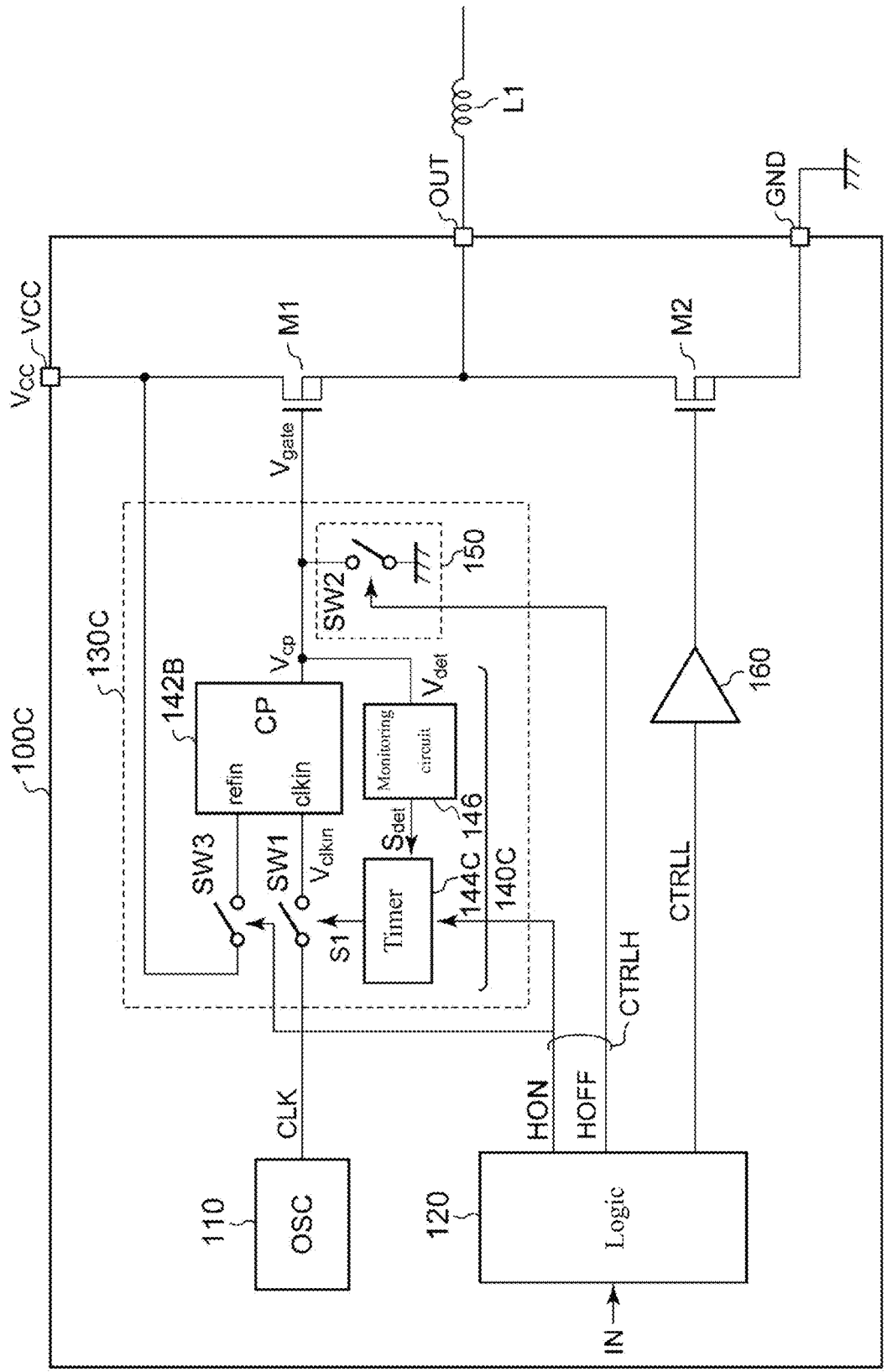
FIG. 8 is a circuit diagram of a motor driver circuit according to a third embodiment.

FIG. 8 shows a circuit diagram of a motor driver circuit 100C according to the third embodiment. In the third embodiment, the control signal HON is supplied to the timer circuit 144C. After the control signal HON changes to high and after the predetermined time τd has elapsed, the timer circuit 144C sets the control signal S1 to high and hence turns on the first switch SW1. Then, after the first switch SW1 is turned on and after the predetermined time $T_{TIMER1}$ has elapsed, the control signal S1 is set to low and hence the first switch SW1 is turned off.

Figure 9:
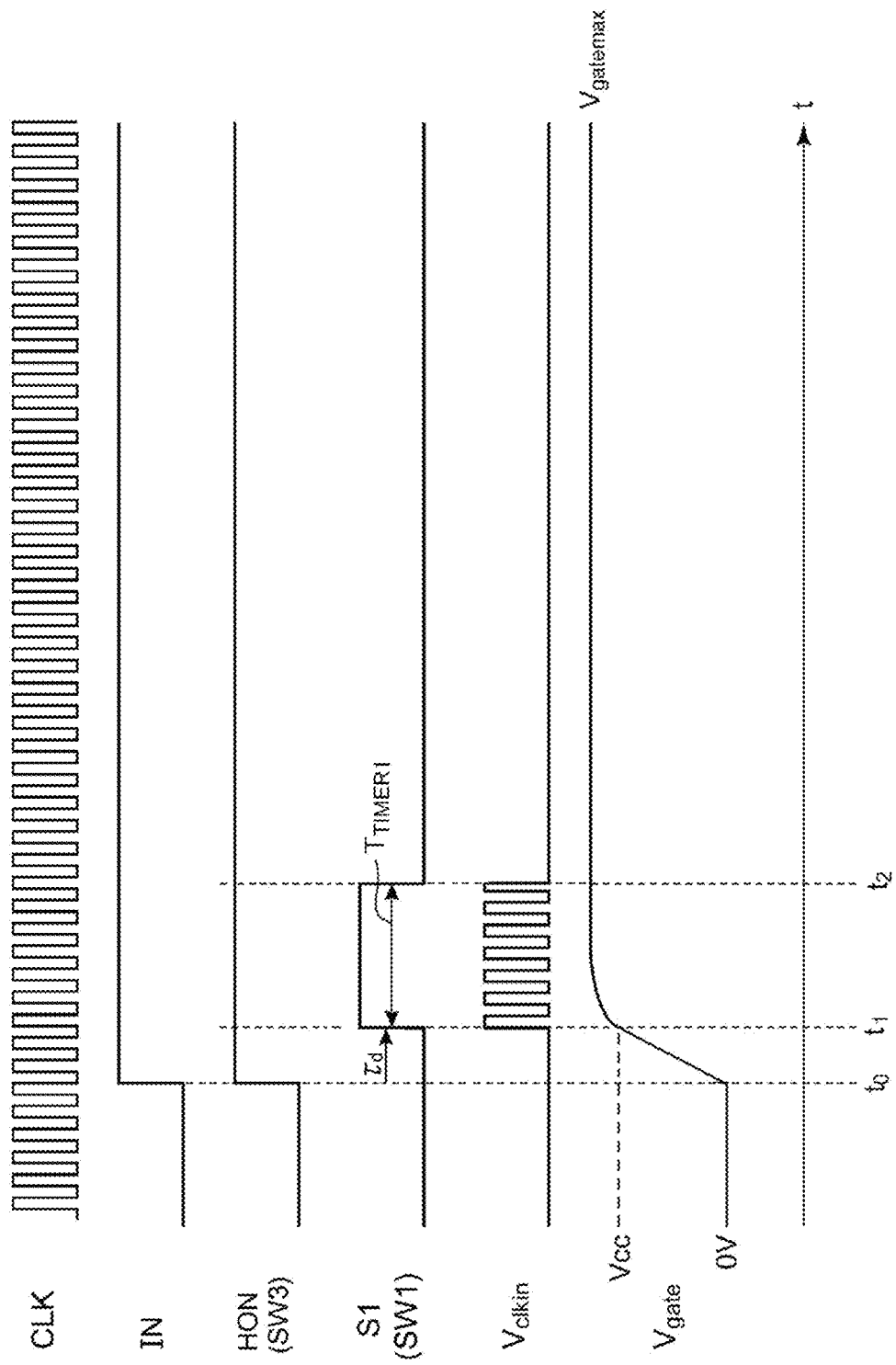
FIG. 9 is a waveform diagram of the operation of the motor driver circuit in FIG. 8.

FIG. 9 shows a waveform diagram of the operation of the motor driver circuit 100C in FIG. 8. According to the motor driver circuit 100C of the third embodiment, the same effects as those of the motor driver circuit 100B of the second embodiment can be achieved.

VARIATION EXAMPLES

Next, several variation examples are described below.

Variation Example 1

The second switch SW2 of the turn-off circuit 150 can be disposed between the gate and the source of the high-side transistor M1.

Variation Example 2

In the embodiments, the high-side transistor M1 and the low-side transistor M2 are built in the motor driver circuit 100; however, they can also be external discrete components. When the high-side transistor M1 and the low-side transistor M2 are discrete components, preferably, the duration of the charging period is adjustable according to the gate capacitor, and for the motor driver circuits 100A and 100B of the first and second embodiments, the time of the timer circuits can be set externally.

Variation Example 3

In the embodiment, supplying of the clock signal to the charge pump circuit 142 is performed or stopped according to on and off of the first switch SW1; however, the present disclosure is not limited to the example above. When the oscillator that generates the clock for the logic circuit 120 and the oscillator that generates the clock for the charge pump circuit are independent, the charge control circuit 138 controls turning on and off of the oscillator for the charge pump circuit.

Note

The following technology is disclosed in the present disclosure.
(Item 1)
A motor driver circuit, comprising:
a logic circuit, configured to generate a control signal that instructs a high-side transistor to turn on or off; and
a high-side driver, configured to drive the high-side transistor according to the control signal, wherein
the high-side driver includes:
a voltage monitoring circuit, configured to
compare a detection voltage with a threshold value, wherein the detection voltage is a gate voltage or a gate-source voltage of the high-side transistor, and
assert a detection signal when the detection voltage becomes lower than the threshold value;
a timer circuit, configured to start measuring a predetermined time in response to the control signal changing to an on state that the high side transistor is instructed to turn on, or in response to assertion of the detection signal when the control signal is in the on state;
a charge pump circuit, configured to
be active when the timer circuit measures the predetermined time, generate a boosted voltage in response to a clock signal, and
supply the boosted voltage to a gate of the high-side transistor; and
a turn-off circuit, configured to reduce a voltage at the gate of the high-side transistor when the control signal instructs the high-side transistor to turn off.
(Item 2)
The motor driver circuit of Item 1, further comprising:
an oscillator, configured to generate the clock signal; and
a first switch, connected between an output node of the oscillator and a clock input node of the charge pump circuit, wherein
the first switch is controlled by an output of the timer circuit.
(Item 3)
The motor driver circuit of Note 1 or 2, wherein the turn-off circuit includes a second switch connected between the gate of the high-side transistor and a ground, or between the gate and a source of the high-side transistor.
(Item 4)
The motor driver circuit of Item 1 or 2, wherein
the charge pump circuit includes a reference input node and is configured to be outputtable a voltage greater than the voltage supplied to the reference input node by a predetermined voltage in response to the clock signal,
the motor driver circuit further comprises a third switch connected between the reference input node of the charge pump circuit and a drain of the high-side transistor,
the third switch is turned on when the control signal changes to the on state, and after a delay, the timer circuit is configured to start measuring the predetermined time.
(Item 5)
The motor driver circuit of any one of Notes 1 to 4, wherein the motor driver circuit is integrated on one semiconductor substrate.

The invention claimed is:
1. A motor driver circuit, comprising:
a logic circuit, configured to generate a control signal that instructs a high-side transistor to turn on or off; and
a high-side driver, configured to drive the high-side transistor according to the control signal, wherein
the high-side driver includes:
a voltage monitoring circuit, configured to
compare a detection voltage with a threshold value, wherein the detection voltage is a gate voltage or a gate-source voltage of the high-side transistor, and
assert a detection signal when the detection voltage becomes lower than the threshold value;
a timer circuit, configured to start measuring a predetermined time in response to the control signal changing to an on state that the high side transistor is instructed to turn on, or in response to assertion of the detection signal when the control signal is in the on state;
a charge pump circuit, configured to
be active when the timer circuit measures the predetermined time,
generate a boosted voltage in response to a clock signal, and
supply the boosted voltage to a gate of the high-side transistor; and
a turn-off circuit, configured to reduce a voltage at the gate of the high-side transistor when the control signal instructs the high-side transistor to turn off.
2. The motor driver circuit of claim 1, further comprising:
an oscillator, configured to generate the clock signal; and
a first switch, connected between an output node of the oscillator and a clock input node of the charge pump circuit, wherein
the first switch is controlled by an output of the timer circuit.
3. The motor driver circuit of claim 2, wherein the turn-off circuit includes a second switch connected between the gate of the high-side transistor and a ground, or between the gate and a source of the high-side transistor.
4. The motor driver circuit of claim 2, wherein
the charge pump circuit includes a reference input node and is configured to be outputtable a voltage greater than the voltage supplied to the reference input node by a predetermined voltage in response to the clock signal,
the motor driver circuit further comprises a third switch connected between the reference input node of the charge pump circuit and a drain of the high-side transistor, the third switch is turned on when the control signal changes to the on state, and after a delay, the timer circuit is configured to start measuring the predetermined time.

5. The motor driver circuit of claim 2, wherein the motor driver circuit is integrated on one semiconductor substrate.

6. The motor driver circuit of claim 1, wherein the turn-off circuit includes a second switch connected between the gate of the high-side transistor and a ground, or between the gate and a source of the high-side transistor.

7. The motor driver circuit of claim 1, wherein
the charge pump circuit includes a reference input node and is configured to be outputtable a voltage greater than the voltage supplied to the reference input node by a predetermined voltage in response to the clock signal,
the motor driver circuit further comprises a third switch connected between the reference input node of the charge pump circuit and a drain of the high-side transistor,
the third switch is turned on when the control signal changes to the on state, and after a delay, the timer circuit is configured to start measuring the predetermined time.

8. The motor driver circuit of claim 1, wherein the motor driver circuit is integrated on one semiconductor substrate.

\* \* \* \* \*